United States Patent [19]

Chism

[11] Patent Number: 5,184,065
[45] Date of Patent: Feb. 2, 1993

[54] TWIST LOCK PROBE TIP

[75] Inventor: Warren L. Chism, Vancouver, Wash.

[73] Assignee: Tektronix, Inc., Wilsonville, Oreg.

[21] Appl. No.: 772,751

[22] Filed: Oct. 7, 1991

Related U.S. Application Data

[62] Division of Ser. No. 416,792, Oct. 2, 1989, abandoned.

[51] Int. Cl.⁵ .............................................. G01R 1/06
[52] U.S. Cl. .................................. 324/158 P; 324/72.5
[58] Field of Search ............... 324/158 P, 158 F, 72.5; 439/482

[56] References Cited

PUBLICATIONS

Best Products Catalog; Fall 1987; p. 133.

Primary Examiner—Ernest F. Karlsen
Attorney, Agent, or Firm—William K. Bucher

[57] ABSTRACT

A twist lock probe tip has a flexible body of an insulative material with an electrical conductor embedded within the flexible body or coated on one side of a flat flexible body. The flexible body has a notch for exposing the embedded electrical conductor and/or for engaging a lead of an electrical component. The flexible body is inserted between the leads of the electrical component and twisted by means of an attached knob or wing lever so that the notches engage adjacent leads and the conductor contacts the desired lead.

4 Claims, 3 Drawing Sheets

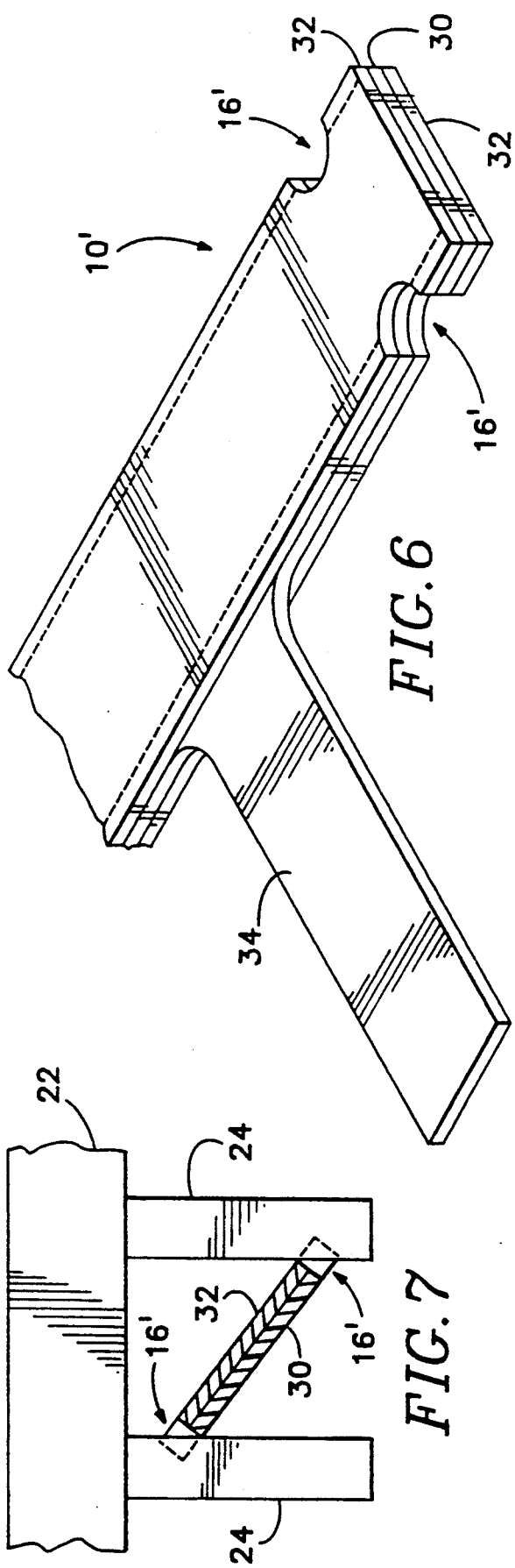
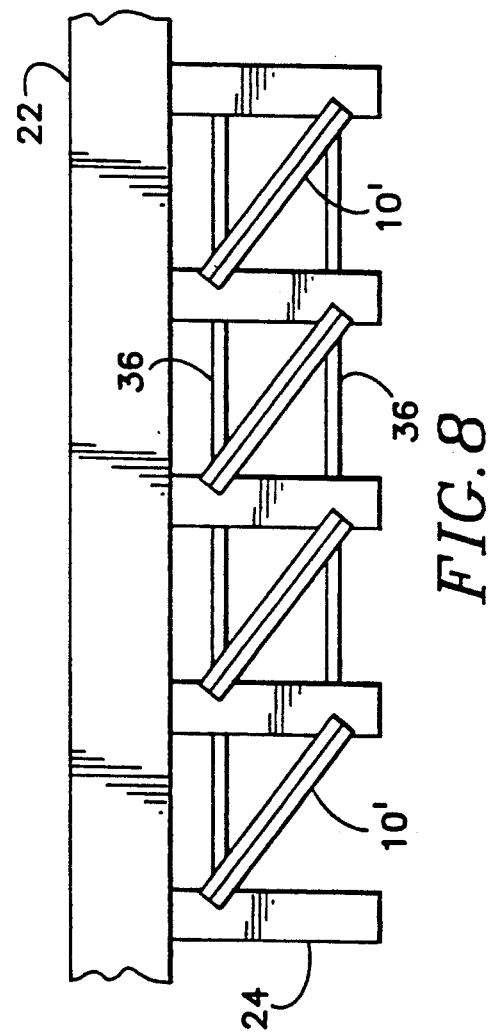

TWIST LOCK PROBE TIP

This is a division of application Ser. No. 07/416,792 filed Oct. 2, 1989, now abandoned.

BACKGROUND OF THE INVENTION

The present invention relates to miniature probe technology for the measurement of electrical signals, and more particularly to a twist lock probe tip for use with a passive probe configured to provide a mechanism for anchoring the probe tip to the leads of a leaded integrated circuit package.

In the testing and troubleshooting of electrical equipment it is necessary to make electrical contact at many places on a circuit board, as well as to leads of various components on the circuit board such as integrated circuits. A common configuration for integrated circuits is a leaded package having leads closely spaced projecting from opposing parallel sides of the package. As the number of leads per package increases and the integrated circuit size decreases, the spacing between leads becomes very small, i.e., less than 100 mils. Current small probe tips either require the operator to hold the probe against the component's lead, or employ enough exposed metal so that there is significant risk of contacting two leads at the same time, electrically shorting one lead to the other with resulting damage to the component.

One example of the prior art probe tips is a grabber tip that has either a rigid or flexible insulated tube within which there is an electrical conductor. The electrical conductor has a hook at the end to "grab" an integrated circuit lead, and is spring biased to be retracted into the insulated tube. The hook is opened when the conductor is extended out of the tube under pressure, and then closes around the component lead when the pressure is released and the spring bias retracts the conductor back into the tube. However this configuration, although providing a means for anchoring the probe tip to the lead, has exposed metal that can short adjacent leads when attempting to connect the probe tip to the desired lead. For spacings of 50 mils or smaller the grabber tip becomes too awkward to use.

What is desired is a probe tip for small probes that may be anchored to contact a single lead of an integrated package without running the risk of shorting adjacent leads and that is usable with small lead spacings of 50 mils or less.

Summary of the Invention

Accordingly the present invention provides a twist lock probe tip of appropriate size for electrically connecting a probe to a desired lead of a leaded integrated circuit package without the risk of shorting the desired lead to an adjacent lead. A conductor is embedded in a thin, flexible strand of insulative material, or coated on one or both sides of a flat, flexible insulative material. The insulative material has a notch in it that serves to expose the embedded conductor and/or provide a means for locking the probe tip between adjacent leads of the integrated circuit package. The probe tip is inserted between leads of the package and given a quarter turn so that the notch engages an adjacent lead and the conductor contacts the desired lead.

The objects, advantages and novel features of the present invention are apparent from the following detailed description when read in conjunction with the appended claims and attached drawing.

BRIEF DESCRIPTION OF THE DRAWING

FIG. 6 is a perspective view of a flat twist lock probe tip according to the present invention.

FIG. 7 is a partial cross-sectional view of the flat twist lock probe tip in operation according to the present invention.

FIG. 8 is a plan view of a ganged flat twist lock probe tip in operation according to the present invention.

DESCRIPTION OF THE PREFERRED EMBODIMENT

Figure 1:
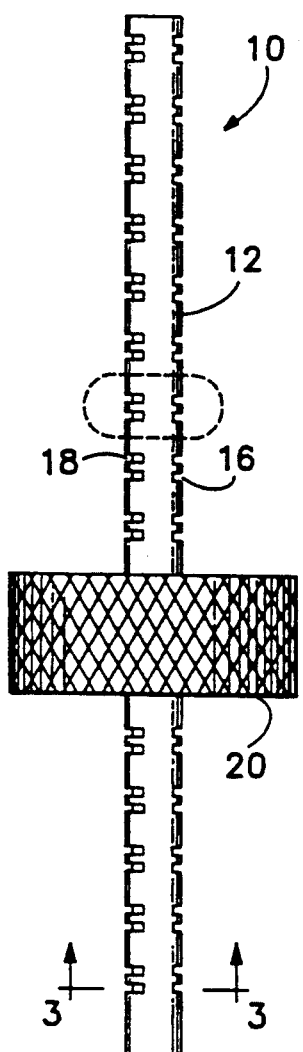
FIG. 1 is a top plan view of a twist lock probe tip according to the present invention.
Figure 2:
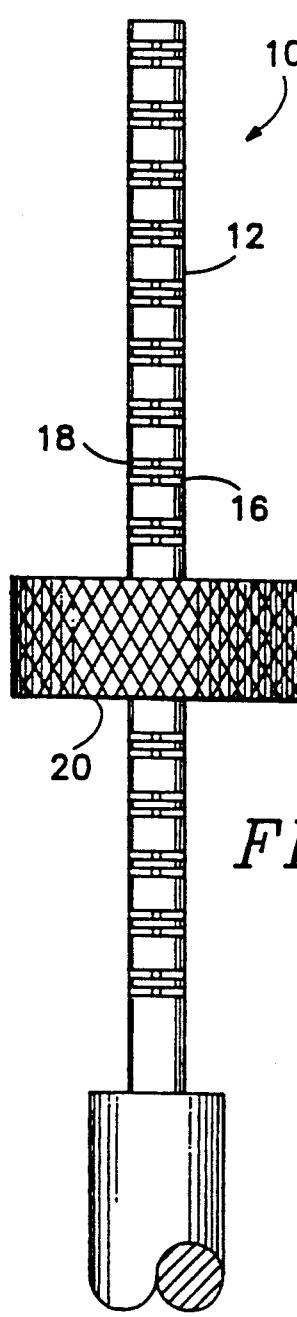
FIG. 2 is a side plan view of the twist lock probe tip of FIG. 1.
Figure 3:
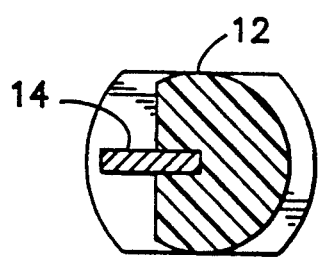
FIG. 3 is a cross-sectional view of the twist lock probe tip of FIG. 1 taken along line 3—3.
Figure 4:
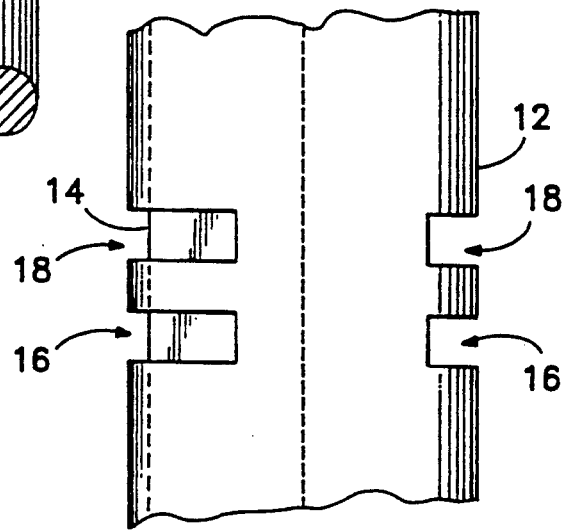
FIG. 4 is an exploded top plan view of a portion of the twist lock probe tip of FIG. 1.

Referring now to FIGS. 1–4 a first embodiment of a twist lock probe tip 10 is shown. The probe tip 10 has a flexible body 12 of an insulative material, such as a plastic material, that has an electrical conductor 14 embedded within it. The flexible body 12 has at least one notch 16 on opposing sides of the flexible body so as to expose the electrical conductor 14 within one of the notches. As shown there are a plurality of sets of notches grouped in pairs to provide for extended use of the probe tip 10. The first set of notches 18 of the pairs is a trim notch that determines a point where a portion of the probe tip 10 may be broken off. Therefore when the conductor 14 within a contact notch set 16 is worn out, the probe tip 10 may be trimmed and another contact notch set used with a fresh portion of the conductor exposed. Also attached to the flexible body 12 by any suitable means, such as a set screw, is a knob 20 by which an operator may grip the probe tip 10 when inserting the tip between leads of an integrated circuit leaded package.

Figure 5:
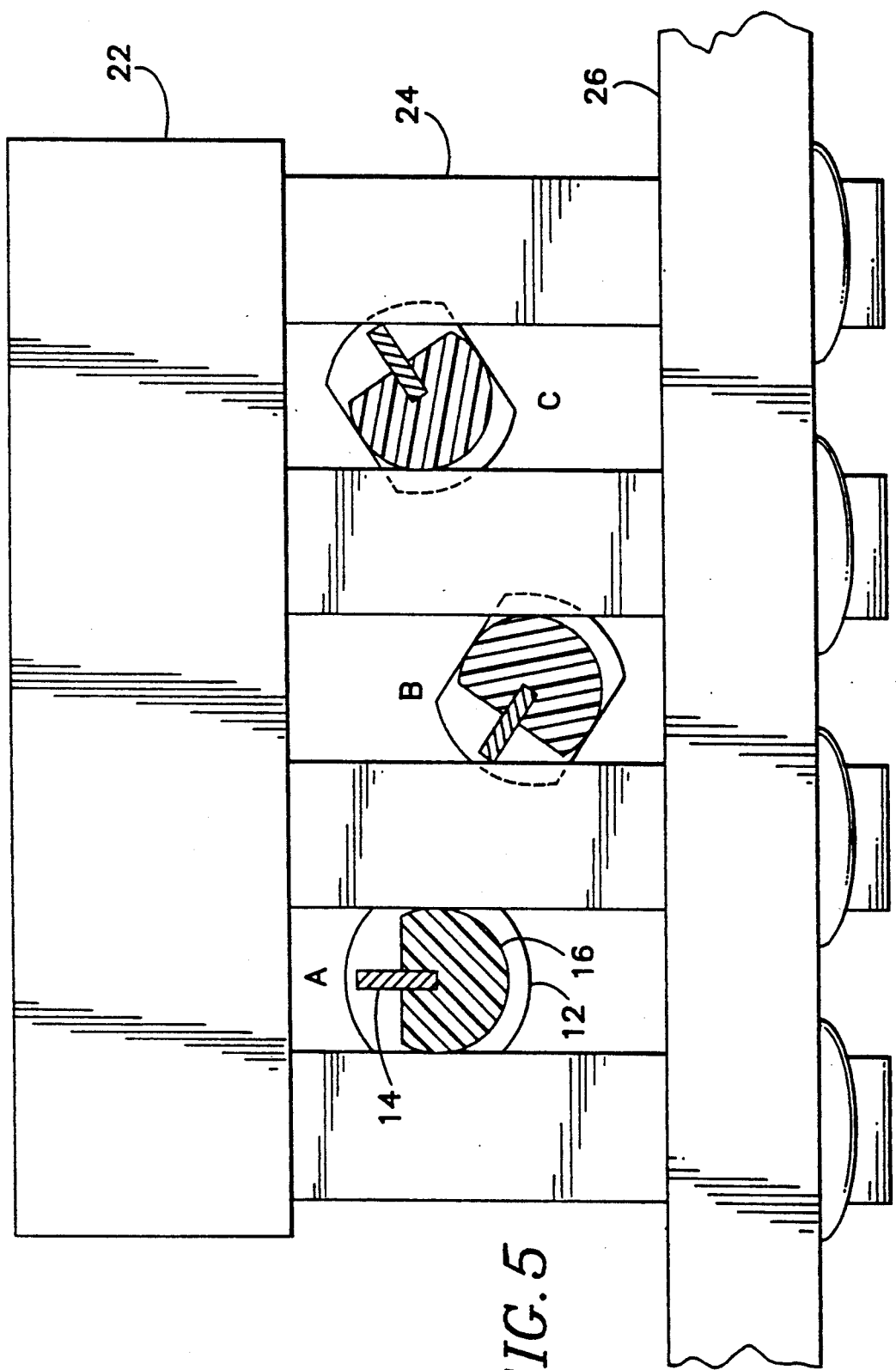
FIG. 5 is a partial cross-sectional view illustrating the operation of the twist lock probe tip according to the present invention.

In operation, as shown in FIG. 5, the probe tip 10 is inserted between package leads as at A and positioned as illustrated. Since there is no exposed metal that can contact two adjacent leads simultaneously, there is no risk of inadvertent shorting of adjacent leads. Then the operator gives the probe tip 10 a quarter turn via the knob 20, either clockwise or counterclockwise as shown at B and C, so that the exposed portion of the conductor 14 in one notch 16 contacts the desired lead and the opposing notch 16 engages the adjacent lead. The spring force of the material of the flexible body 12 holds the embedded conductor 14 securely against the lead, locking the probe tip 10 in place.

To accommodate different lead spacings on a single probe tip 10 the flexible body 12 could be tapered, and the probe tip trimmed to expose the set of notches having the proper size for the particular lead spacing.

Another embodiment of the twist lock probe tip is shown in FIGS. 6 and 7. For very narrow spacings between leads, such as 50 mils or less where embedment of the conductor 14 in the flexible body 12 is difficult, a flat flexible body 30 has a conductor 32 coated by any suitable means on one or both sides with the notches 16' on the opposing sides of the flexible body. Again the probe tip is inserted between component leads 24 with the conductive side facing one of the leads. Again the probe tip 10' is given a quarter turn so that the conductor 32 contacts the desired lead 24 within the notches 16', and the notches engage the adjacent leads to lock the probe tip in place. A wing 34 integral with the flat flexible body 30 acts as a lever in conjunction with the force of gravity to provide torque to the probe tip 10'. The torque force may be applied manually by an operator or by a spring force against the wing 34 by its flexibility when the probe tip 10' is inserted between leads and the wing is deformed in contact with the circuit board 26. With the conductor 32 coated on both sides, the probe tip makes electrical contact with adjacent leads without shorting between them. Alternatively the conductor 32 may be coated in such a manner, as shown by the dotted lines, that the conductor does not extend the complete width of the flat flexible body 30 except at the notches 16'. The width between the notches 16' is adapted according to the spacing of the leads of the integrated circuit 22 with which it is used. As shown in FIG. 8 a plurality of probe tips 10' may be ganged together, such as by rotatably being mounted on a pair of torque bars, so that several leads may be individually contacted simultaneously.

Thus the present invention provides a twist lock probe tip that has a conductor embedded within or coated on one side of a flexible body, the flexible body having notches to expose the conductor and/or engage the leads. The flexible body is inserted between the leads and given a quarter turn so that the notches may engage adjacent leads, locking the probe tip in place with electrical contact occurring only with the desired lead.

What is claimed is:

1. A twist lock probe tip for an electrical test probe comprising:
    a flat elongate body of an insulating material having opposing notches formed therein for engaging leads of an integrated circuit device; and
    a conductor coated on one of the surfaces of the flat elongate body with the conductor exposed within the notches for making electrical contact with one of the leads of the integrated circuit device, the other lead being in contact with the insulating elongate body.

2. A twist lock probe tip as recited in claim 1 further comprising a wing lever integral with the flat elongate body extending from the edge of the flat elongate body.

3. The twist lock probe tip as recited in claim 1 further comprising a second conductor coated on an opposite surface of the flat elongate body with the second conductor exposed within the notches for making electrical contact with the other lead of the integrated circuit device, the insulating elongate body providing electrical isolation between the respective conductor connections on the leads of the integrated circuit device.

4. A twist lock probe tip as recited in claim 3 further comprising a wing lever integral with the flat elongate body extending from the edge of the flat elongate body.

* * * * *